(12) United States Patent
Narayanaswamy et al.

(10) Patent No.: US 7,346,731 B2
(45) Date of Patent: Mar. 18, 2008

(54) HIGH PERFORMANCE AND SCALABLE WIDTH EXPANSION ARCHITECTURE FOR FULLY PARALLEL CAMS

(75) Inventors: Santhosh Narayanaswamy, Bangalore (IN); Nisha Padattil Kuliyampattil, Karnataka (IN); Rashmi Sachan, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 185 days.

(21) Appl. No.: 11/384,725

(22) Filed: Mar. 20, 2006

(65) Prior Publication Data
US 2007/0217244 A1 Sep. 20, 2007

(51) Int. Cl.
*G06F 12/00* (2006.01)
(52) U.S. Cl. .......................................... 711/108; 711/5
(58) Field of Classification Search ............... 711/108, 711/5; 365/49
See application file for complete search history.

(56) References Cited

U.S. PATENT DOCUMENTS 6,842,358 B2 * 1/2005 Khanna ....................... 365/49
7,062,601 B2 * 6/2006 Becca et al. ................. 711/108
7,257,670 B2 * 8/2007 Feldmeier .................... 711/108
2005/0120283 A1 * 6/2005 Harris et al. ................. 714/718

* cited by examiner

*Primary Examiner*—Vu A. Le
(74) *Attorney, Agent, or Firm*—Alan K. Stewart; W. James Brady; Frederick J. Telecky, Jr.

(57) ABSTRACT

A technique that provides highly scalable width expansion architecture for cascading CAMs to facilitate searching of increased wordlengths. In one example embodiment, this is achieved by combining a plurality of CAM devices in a serial cascade arrangement. Each CAM device of the serial cascade arrangement receives a portion of the search word. Each of the CAM devices in the serial cascade arrangement includes a CAM, a plurality of GMAT lines, a dummy match line, and a GMAT interface circuitry. The GMAT interface circuitry facilitates driving the match signals from a substantially previous CAM to a substantially adjacent CAM. The last CAM device is coupled to a match latch and a priority encoder. The first CAM device provides a single mismatch signal on an associated dummy match line for coordinating match signals associated with the plurality of GMAT lines of each of the plurality of CAM devices and to transfer the match signals from the last CAM device to the match latch circuit and the priority encoder and to output a combined search result.

8 Claims, 4 Drawing Sheets

HIGH PERFORMANCE AND SCALABLE WIDTH EXPANSION ARCHITECTURE FOR FULLY PARALLEL CAMS

TECHNICAL FIELD OF THE INVENTION

The present invention relates generally to digital integrated circuits, and more particularly relates to cascading a plurality of content addressable memories (CAMs).

BACKGROUND OF THE INVENTION

Content addressable memory (CAM) is being increasingly used in search engines today. It is a type of memory that in addition to allowing to perform read and write operations, it accepts data as input and returns an address as its output. This is in contrast to the normal memory, which only takes an address as an input and returns data stored at that address as an output.

A typical CAM contains, among other logic blocks: a CAM array block, a match detection block, and a priority encoder block. A CAM receives a data input, a data sample often termed a "word" (i.e., a plurality of bits or trits) even though its size is not standard and in current usage it is often quite long. The CAM array block contains CAM cells and comparison logic. The match detection block contains logics and sense amplifiers which determine if such a word being processed has any matches and produces a match signal for each content word compared against. The priority encoder block contains logics to process the set of match signals and to determine from it any matches of a received word are indicated, and to pick among all such matches to establish one as having priority according to a pre-established rule. The CAM then outputs the address of the highest priority match as a result output.

In the CAMs, as the wordlength (i.e., width) of a CAM entry increases, the capacitance of each CAM entry's match line generally also increases proportionately. This can result in reducing the reliability of detecting a match state because of a much smaller voltage change on a match line having a potentially large and entry-width dependent capacitance. The larger the match line's capacitance, the longer it will take to discharge in the case of mismatch entry, in turn requiring a longer detection period.

Therefore, when storage requirements exceed the number of entries (i.e., when the width increases) that may be stored on a single CAM, multiple CAMs are cascaded together to expand the number of search entries. Conventional techniques achieve the cascading of the CAMs by employing well known methods, which pipeline the match outputs of each CAM using flops or by increasing the hierarchy of match evaluations to connect a plurality of CAMs to facilitate searching as a single entry.

However, these techniques generally process outputs of each CAM instances which can result in requiring logic intensive post processing circuits that can be complex and produce irregular outputs. Further, these techniques can have a significant latency in generating a final search result. Furthermore, these techniques use hierarchical combination of local evaluation results which are slow in a precharge/evaluate scheme due to large interconnect lengths as the CAM size increases. Also, these techniques can require hierarchical evaluation which may result in limited width expansion even for reasonable speed targets. In addition, the hierarchical evaluation can require additional layout resources which can result in consuming more power switching long interconnects that may limit the number of CAMs that can be cascaded. Moreover, these techniques are only feasible to cascade a fewer number of CAMs. It is generally difficult to achieve such wordlengths using the current techniques in a single CAM.

SUMMARY OF THE INVENTION

According to an aspect of the present subject matter, there is provided an apparatus for cascading a plurality of CAMs to form a wider CAM than currently possible with a single CAM. The apparatus includes a first CAM device, a plurality of global match (GMAT) lines and a dummy match line and their associated outputs. The associated outputs of the first CAM device is coupled to associated plurality of GMAT lines, dummy match lines, their associated outputs of a second through nth CAM device, respectively. The plurality of GMAT lines of each CAM device receives a portion of the search word upon application of a clock in search mode. Upon application of the clock cycle a dummy single mismatch signal is induced into the dummy match line by the first CAM device. A match latch circuit including a plurality of latches is coupled via the associated plurality of GMAT lines, the associated dummy match line used for clocking match latches and the associated outputs to the nth CAM device to store associated match signals received from the nth CAM device. A priority encoder coupled to the match latch circuit receives the stored match signals from the match latch circuit and outputs a combined search result upon receiving the single mismatch signal via the dummy match line associated with each CAM device.

DETAILED DESCRIPTION OF THE INVENTION

In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

Figure 1:
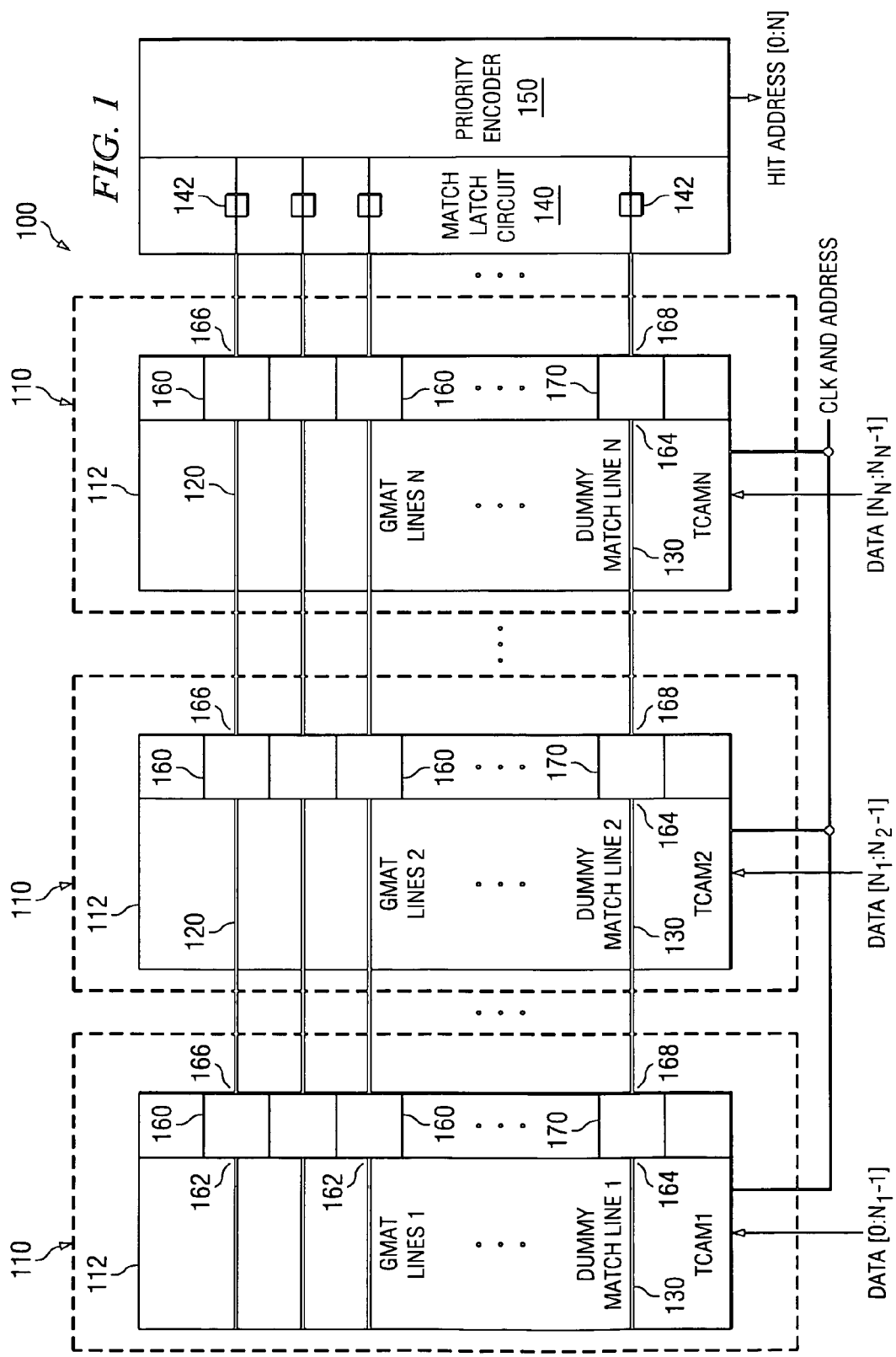
FIG. 1 is a schematic diagram of a CAM system according to an embodiment of the present invention.

Referring now to FIG. 1, there is illustrated an example embodiment of a CAM system 100 according to the present invention. The CAM system 100 includes a plurality of CAM devices 110 in a serial cascade arrangement, a match latch circuit 140 coupled to a last CAM device 110 in the serial cascade arrangement, and a priority encoder 150 coupled to the match latch circuit 140. As shown in FIG. 1, each CAM device 110 includes a CAM 112, plurality of GMAT lines 120 and a dummy match line 130. In some embodiments, the CAM 112 is a TCAM.

Each of the first through the (n-1)th CAM devices in the plurality of CAM devices 110 is coupled via the plurality of GMAT lines 120 to an associated GMAT interface circuitry 160. The last CAM device in the plurality of CAM devices 110 is coupled via the associated plurality of GMAT lines 120 and the associated dummy match line 130 to a plurality of associated last GMAT interface circuitry. In these embodiments, the dummy match line 130 is used to clock match latches. Further as shown in FIG. 1, each of the (n-1) the CAM devices in the plurality of CAM devices is coupled via the dummy match line 130 to an associated clock interface circuitry 170.

Also shown in FIG. 1, each CAM device is coupled to a substantially adjacent CAM device in a serial cascade arrangement in the CAM system 100 via the plurality of GMAT lines 120 and the dummy match line 130. The number of CAM devices that can be connected in the serial cascade arrangement shown in FIG. 1 is generally limited by the aspect ratio of a silicon chip.

As shown in FIG. 1, the associated GMAT interface circuitry 160 has a plurality of GMAT input terminals 162 and a dummy match line input terminal 164. In addition as shown in FIG. 1, the associated GMAT interface circuitry 160 has a plurality of GMAT output terminals 166 and a dummy match line output terminal 168. It can be envisioned that each of the plurality of associated last GMAT interface circuitry has a plurality of GMAT input terminals, a dummy match line input terminal, a plurality of GMAT output terminals, and a dummy match line output terminal.

Further as shown in FIG. 1, the plurality of GMAT lines 120 and the dummy match line 130 of a first CAM device 110 in the serial cascade arrangement is coupled to the plurality of GMAT input terminals 162 and the dummy match line input terminal 164, respectively, of the associated GMAT interface circuitry 160. Similarly, it can be envisioned that the plurality of GMAT lines 120 and the dummy match line 130 of a last CAM device 110 in the serial cascade arrangement is coupled to the plurality GMAT input terminals and the dummy match line input terminal of each of the plurality of associated last GMAT interface circuitry. Also as shown in FIG. 1, the plurality of GMAT output terminals and the dummy match line output terminal 168 of the associated GMAT interface circuitry 160 is coupled to the plurality of GMAT lines 120 and the dummy match line 130 of a second CAM device 110 in the serial cascade arrangement. Similarly, the plurality of the GMAT output terminals 166 and the dummy match line output terminal 168 of the second CAM device 110 is coupled the plurality of the GMAT lines 120 and the dummy match line 130 of the substantially adjacent CAM device 110.

Furthermore as shown in FIG. 1, the match latch circuit 140 has a plurality of latches 142. It can be envisioned that the plurality of latches 142 are coupled to the plurality of GMAT output terminals and the dummy match line output terminal of the last CAM device 110 in the serial cascade arrangement. In some embodiments, each CAM device in the CAM system 100 is positioned in serial cascade formation to minimize the physical distances between the first through the nth CAM device 110, the match latch circuit 140 and the priority encoder 150.

Figure 2:
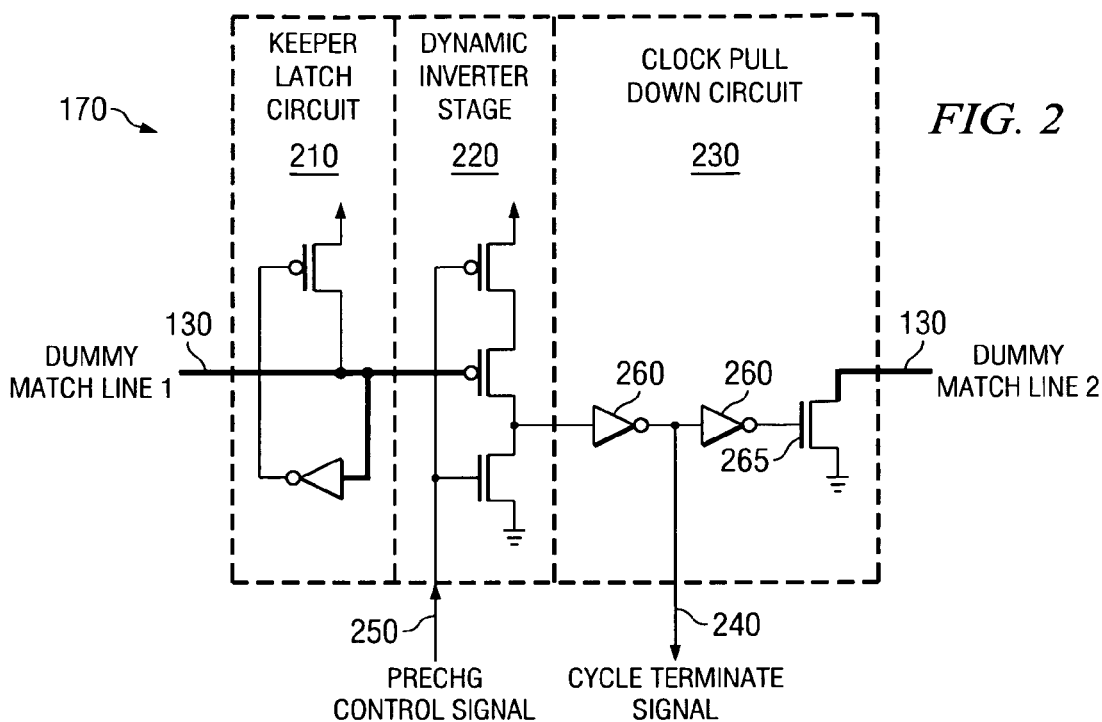
FIG. 2 is an example schematic diagram of an interface circuitry on a dummy match line in a CAM array of a CAM system, such as those shown in FIG. 1.

Referring now to FIG. 2, there is illustrated an example embodiment of the clock interface circuitry 170 connected to the dummy match line 130 of a CAM device 110 in a CAM array of a CAM system 100, as shown in FIG. 1. As shown in FIG. 2, the clock interface circuitry 170 includes a keeper latch circuit 210, a dynamic inverter stage 220 coupled to the keeper latch circuit 210, and a clock pull down circuit 230 coupled to the dynamic inverter stage 220. Also as shown in FIG. 2, the dynamic inverter stage 220 is coupled to receive a precharge control signal 250 and the clock pull down circuit 230 generates a cycle terminate signal 240.

In addition as shown in FIG. 2, the dummy match line 130 of a preceding CAM device is coupled to the keeper latch circuit 210 and the dummy match line 130 of a substantially adjacent CAM device is coupled to the clock pull down circuit 230. Further as shown in FIG. 2, the clock pull down circuit 230 includes two inverters 260 coupled to a pull down transistor 265. As shown in FIG. 2, the drain of the pull down transistor 265 is coupled to the dummy match line 130 of a substantially adjacent CAM device in the CAM system 100 (shown in FIG. 1).

In operation, the dummy match line 130 in the CAM system 100 (shown in FIG. 1) is held in a precharged state, i.e., in a logic high state. Upon applying a clock signal on to CAM device 110 the first CAM device 110 induces a single mismatch signal, which is a timing signal, on the dummy match line 130. This causes the dummy match line 130 to go to a logic low state. Substantially about the same time the precharge control signal 250 also goes to a logic low state. This causes the dynamic inverter stage 220 to go to an evaluation mode and switches to a logic high state. The inverters 260 in the clock pull down circuit 230 then boost the output of the dynamic inverter stage 220. The output of the second inverter is then used to control the pull down transistor 265. Upon the second inverter switching to the logic high state the pull down transistor 265 starts conducting and brings down the dummy match output to a logic low state. In these embodiments, the pull down transistor 265 is larger than the match transistors in the CAM 112 (shown in FIG. 1). When the dummy match output from the clock interface circuitry 170 associated with the preceding CAM device 110 (shown in FIG. 1) goes to a logic low state, the dummy match line 130 associated with the substantially adjacent CAM device 110 (shown in FIG. 1) is pulled down to a logic low stage. This is equivalent to inducing a single mismatch signal in the substantially adjacent CAM device 110 (shown in FIG. 1). This process repeats itself in each CAM device so that a single mismatch signal travels from the first CAM device through the nth CAM device in the CAM system 110 (shown in FIG. 1) to control timing in each CAM device.

As the single mismatch signal travels through the CAM devices in the CAM system 100 (shown in FIG. 1), a cycle terminate signal 240 is tapped from the first inverter of the inverters 260 in the clock pull down circuit 230. The cycle terminate signal 240 is used to end the operation of the preceding CAM device and restore it to the normal state. In addition, the cycle terminal signal 240 signifies that the match signals from the plurality of GMAT lines 120 in the preceding CAM device is available at the GMAT output terminals 166 for outputting to the plurality of GMAT lines in the substantially adjacent CAM device (shown in FIG. 1).

In these embodiments, the keeper latch circuit 210 is used to counter leakage after the precharge signal is turned off upon application of the clock signal on to the dummy match line 130. Further in these embodiments, the keeper latch circuit 210 is used to emulate a substantially same condition as in a GMAT line in the CAM device (shown in FIG. 1). Also in these embodiments, upon receiving the cycle terminate signal 240 by the CAM 112, the dummy match line 130 is restored to a logic high state by precharging the dummy match line 130 (shown in FIG. 1).

Figure 3:
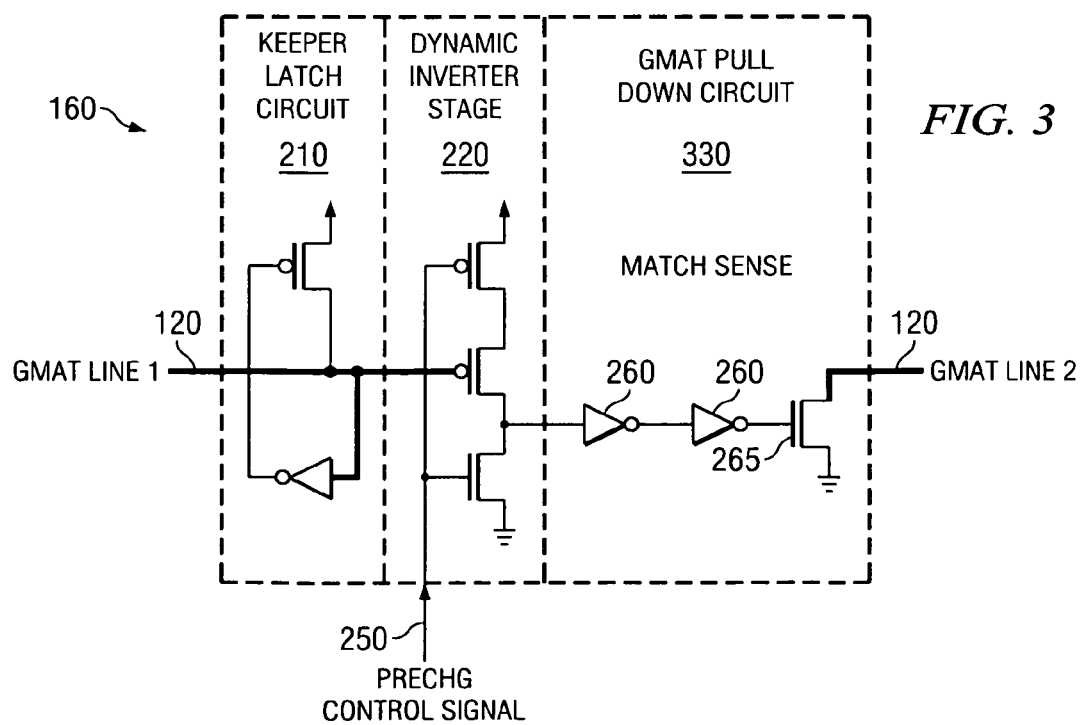
FIG. 3 is an example schematic diagram of a GMAT interface circuitry on a GMAT line of a first CAM array of a CAM system, such as those shown in FIG. 1.

Referring now to FIG. 3 there is illustrated an example embodiment of a GMAT interface circuitry 160 that is coupled to a GMAT line of the first CAM device through the (n-1)th CAM device 110 of the CAM system 100 shown in FIG. 1. The GMAT interface circuitry 160 includes the keeper latch circuit 210, the dynamic inverter stage 220 coupled to the keeper latch circuit 210, and an intermediate stage GMAT pull down circuit 330 coupled to the dynamic inverter stage 220. Further as shown in FIG. 1, the GMAT interface circuitry 160 is coupled to receive the precharge control signal 250.

Also as shown in FIG. 3, the GMAT line 120 of a preceding CAM device is coupled to the keeper latch circuit 210. Further as shown in FIG. 3 the GMAT line 120 of a substantially adjacent CAM device is coupled to the GMAT pull down circuit 330. Furthermore as shown in FIG. 3, the GMAT pull down circuit 330 includes the two inverters 260 that is coupled to the pull down transistor 265 (similarly as shown in FIG. 2). As shown in FIG. 3, the drain of the pull down transistor 265 is coupled to the GMAT line 120 of a substantially adjacent CAM device in the CAM system 100 (shown in FIG. 1). Again, as explained above for the keeper latch circuit 210 with reference to FIG. 2, the function of the keeper latch circuit 210 is also to counter the leakage on the GMAT line and to maintain the precharged state, i.e, the logic high state on the GMAT line 120.

The GMAT interface circuitry 160 is similar to the clock interface circuitry 170 (shown in FIG. 2) except that the GMAT interface circuitry 160 does not generate a clock terminate signal as shown in FIG. 2. In these embodiments, there is a GMAT interface circuitry 160 that is associated with each of the plurality of GMAT lines in the CAM device 110 shown in FIG. 1.

Referring now to FIGS. 1 and 3, initially each of the plurality of GMAT lines 120 is precharged to a logic high state. Again, upon application of the clock signal on to the CAM devices 110 each of the plurality of GMAT lines 120 in the CAM device 110 evaluates a match/mismatch condition depending on the supplied search word. If there is a match in any of the plurality of GMAT lines, then those GMAT lines where a match was found will stay at logic high state. Whereas, the other remaining GMAT lines which has a mismatch condition, i.e, the GMAT lines where a match was not found, will evaluate and goes to a logic low state.

Again, at the start of the GMAT evaluation, the precharge control signal 250 goes to logic low state as described above with reference to FIG. 2. This enables the dynamic inverter stage 220. If a GMAT line in the CAM device evaluates to a logic low state, the associated dynamic inverter stage 220 goes to a logic high state and the output of the inverters 265 goes to logic high state. This turns on the pull down transistor 265. The associated GMAT line output terminal 166 that is connected to the drain of the pull down transistor 265 goes to a logic low state. This pulls the associated GMAT line 120 in the substantially adjacent CAM device 110 to logic low state. In these embodiments, the associated GMAT line 120 of the substantially adjacent CAM device 110 is pulled to a logic low state irrespective of the GMAT evaluation result of the substantially adjacent CAM device 110. This process propagates the mismatch state from the first CAM device to the nth CAM device in the cascaded CAM system 100.

If there is a match condition found in any of the plurality of GMAT lines 120, then those GMAT lines where a match was found will stay at a logic high state. In this condition, the output of the dynamic inverter stage 220 stays at a logic low state and the output of the inverters 260 also stay at a logic low state. In this state, the pull down transistor 265 is not turned on and the associated GMAT output terminal is left floating. Hence this will have no effect on the associated GMAT line of the substantially adjacent CAM device 110 in the CAM system 100. In these embodiments, the dynamic inverter stage 220 coupled to the keeper latch circuit 210 senses a logic low state on the respective GMAT line and generates a mismatch signal upon the precharge signal going to a logic low state. Also in these embodiments, the GMAT pull down circuit 330 outputs a match/mismatch signal to the respective GMAT line associated with a substantially adjacent CAM.

Figure 4:
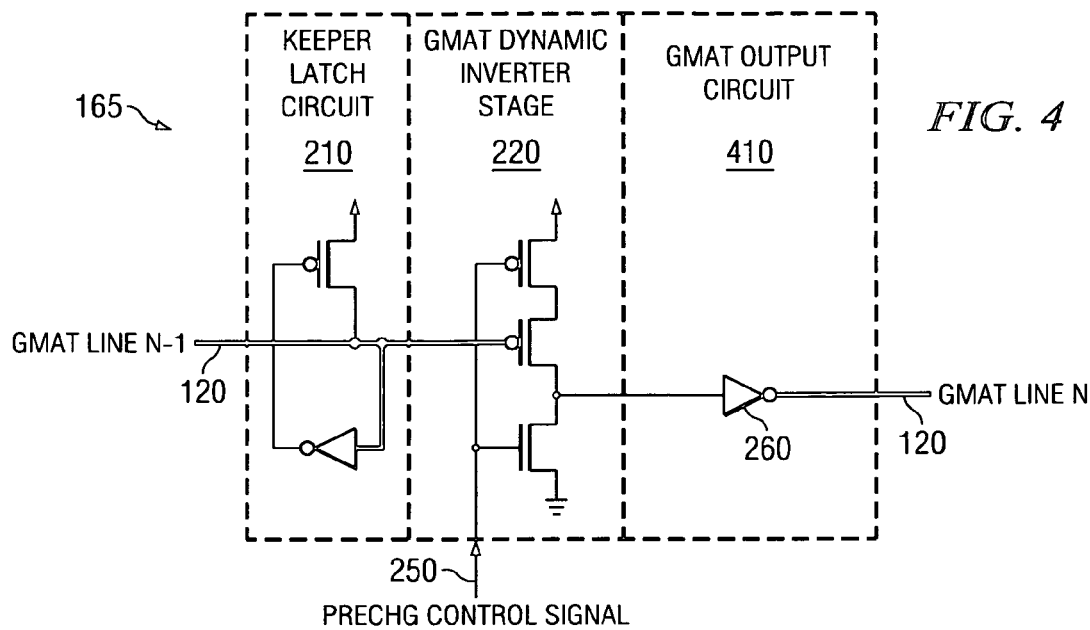
FIG. 4 is an example schematic diagram of a last GMAT interface circuitry on a GMAT line of the last CAM device of the CAM system, such as those shown in FIG. 1.

Referring now to FIG. 4 there is illustrated an example embodiment of a last GMAT interface circuitry 165 that is coupled to the GMAT line 120 associated with the last CAM device in the CAM system 100 (shown in FIG. 1). The last GMAT interface circuitry 165 includes the keeper latch circuit 210, the dynamic inverter stage 220 coupled to the keeper latch circuit 210, and a final stage GMAT inverter stage 410 coupled to the dynamic inverter stage 220. Further as shown in FIG. 4, the GMAT interface circuitry 160 is coupled to receive the precharge control signal 250. As shown in FIG. 4, the last GMAT interface circuitry 165 is similar to the GMAT interface circuitry 160 shown in FIG. 3 expect that the last GMAT interface circuitry 165 has a final stage GMAT driver circuit instead of the GMAT pull down circuit 330 shown in FIG. 3. As shown in FIG. 4, the final stage GMAT driver circuit 410 has only one inverter and does not have the pull down transistor 265 (shown in FIG. 3). Further as shown in FIG. 4, each of the plurality of GMAT lines 120 in the last CAM device is coupled to an associated last GMAT interface circuitry 165.

Again, as explained above with reference to FIG. 3, the function of the keeper latch circuit 210 in the last GMAT interface circuitry 165 is also to counter the leakage on the GMAT line and to maintain the precharged state, i.e, the logic high state on the GMAT line 120. The dynamic inverter stage 220 is used to sense the match/mismatch condition on the GMAT line 120 in the last CAM device (shown in FIG. 1). The single inverter in the final stage GMAT driver circuit 410 is used to buffer the match signal associated with the GMAT line.

Referring now to FIG. 1, in operation, same clock signal and address signal is applied to each of the CAM devices 110 in the CAM system 100. The data inputs, i.e., search word, applied are split between CAM devices 110 in the CAM system. The CAM architecture shown in FIG. 1 is equivalent to a CAM that is significantly wider than each CAM 112 used in the CAM system 100. For example, if there N CAMs in the CAM system 100, with each CAM having m number of bits, then the CAM architecture shown in FIG. 1 provides a CAM having a width of N*M.

In a typical search operation, when using the CAM system 100 shown in FIG. 1, the "match condition" refers to only if a match is found in all the CAMs 112 in the CAM system 100. On the contrary, a single mismatch in any GMAT lines in any CAM 112 results in a "mismatch condition". If a match is found in any GMAT line associated with a CAM device 112, then the match signal output of the associated last GMAT interface circuitry 165 will stay at logic high state. Whereas, if there is a mismatch in any GMAT line, then the match signal output of the associated last GMAT interface circuitry will go to a logic low state.

Figure 5:
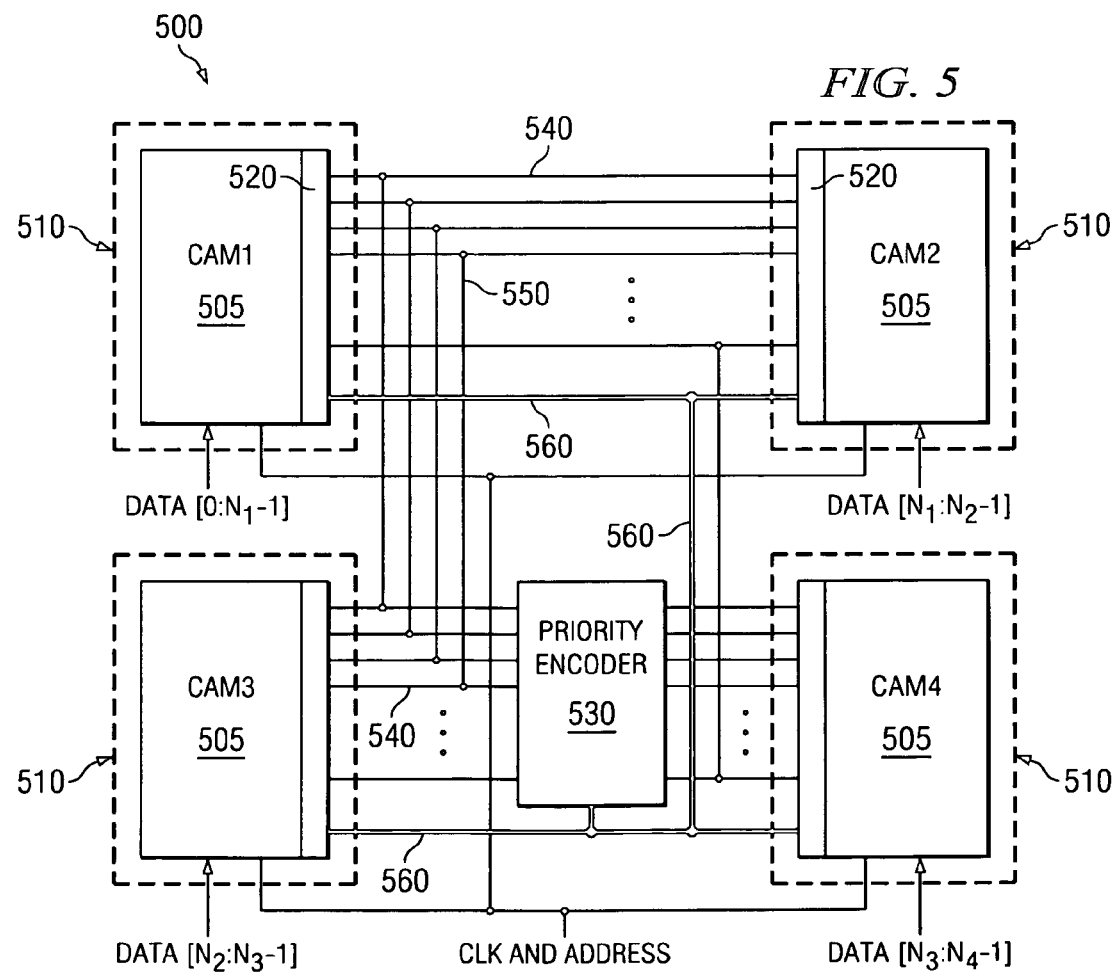
FIG. 5 is a schematic diagram of a hierarchical CAM system according to an embodiment of the present invention.

Referring now to FIG. 5 there is illustrated an example embodiment of another CAM system architecture 500 that can be used to widen the CAM. The CAM system architecture 500 shown in FIG. 5 uses hierarchical cascade scheme. As shown in FIG. 5, the CAM system architecture 500 includes 4 TCAM devices 510. Further as shown in FIG. 5, each TCAM device 510 includes a TCAM 505 and an interface circuitry 520 that includes the clock interface circuitry 170 (shown in FIG. 2) and the GMAT interface circuitry 160 (shown in FIG. 3). Each of the TCAM devices 510 are almost similar to the CAM devices 110 shown with reference to FIG. 1. In this embodiment, the clock interface circuitry has a NAND gate in the cycle terminate signal generation path. In addition as shown in FIG. 5, the 4 TCAMs are coupled using the interface circuitry 520.

In this embodiment, the GMAT lines 540 of each TCAM are connected to the interface circuitry 520. The interface circuitry 520 includes associated match outputs. The match outputs of all the interface circuitry 520 are connected using system GMAT lines 550 as shown in FIG. 5. Also as shown in FIG. 5, the interconnected GMAT line outputs are coupled to the priority encoder 530, i.e., each associated GMAT line from the 4 TCAMs are connected together to input into the priority encoder 530. The hierarchical cascade scheme is achieved by using system GMAT lines 550 that interconnect the 4 TCAM devices 510.

The dummy match line 560 is connected to the associated interface circuitry 520 similar to the connection shown in FIG. 1. The associated dummy match line outputs are not interconnected unlike the GMAT line outputs. The dummy match line output associated with a TCAM device having the highest cycle time is connected to the priority encoder 530. Whereas, the dummy match line outputs associated with the other 3 TCAM devices are not connected to the priority encoder 530.

Again, same clock and address signals are supplied substantially simultaneously to all the 4 TCAMs. The data bits associated with the inputted search word are distributed amongst the 4 TCAMs. For example, if the CAM system 500 has to support a word of width 256 bits, then each TCAM gets 64 bits. In case of an odd number, one or two TCAMs can be made larger than the others. In such a case, the larger TCAM results in having the highest cycle time and the dummy match line associated with this TCAM will be connected to priority encoder 530. In these embodiments, the clock interface circuitry associated with the smaller CAMs is similar to the clock interface circuitry 170 shown in FIG. 2, except that the output of the pull-down transistor is not connected to the output port of the interface circuitry 520 and there is a NAND circuit in the cycle terminate signal generation path.

In operation, the system GMAT lines 550 connecting the GMAT outputs coming from the interface circuitry 520 of each TCAM device 510 is precharged and held in a logic high state. Upon application of the clock signal the precharge control on the system GMAT lines 550 is released. Substantially parallely, all TCAMs 505 individually evaluate their search results. If a result after evaluation on any GMAT line 540 in any TCAM 505 produces a "match condition" then the corresponding pull down transistor in the associated interface circuitry 520 is held in the off position so that the pull down transistor do not discharge the system GMAT lines 550 which connects with GMAT lines 540 associated with other interfaces. If a match condition is found in all the 4 associated GMAT lines after evaluation, then there is an overall match in all the 4 associated GMAT lines and that is inputted into the priority encoder 530.

If any of the GMAT lines 540 evaluates to a mismatch condition, then the pull down transistor of the associated interface circuitry goes to a logic high state and discharge the system GMAT lines 550 which connects to the GMAT lines associated with the other interface circuitry. In this situation, the overall result of the evaluation is a mismatch and this is again fed to the priority encoder 530.

The arrival of the dummy match signal indicates that all match signals associated with the GMAT lines 540 are ready and available at the priority encoder 530. The dummy match signal received via the dummy match line associated with the TCAM having the highest cycle time is used to trigger the priority encoder 530. Substantially parallely the dummy match signal also enables the NAND gate. This generates the cycle terminate signal in each interface circuitry 520 on the dummy match line 560. Upon receiving the cycle terminate signal from each interface circuitry 520 the associated TCAMs precharge the GMAT lines 540 and restore them to the start condition.

Basically, when a clock signal is applied, the precharge on the system GMAT lines 550 are removed. Each TCAM device 510 in the CAM system 500 evaluates their match results and drives them to the system GMAT lines 550. As explained above, the cycle time to complete the evaluation of the search results on the system GMAT lines 550 depends on the largest TCAM which takes the highest amount of time to evaluate the match results. The NAND gates in the interface circuitry is coupled to the associated dummy match lines 560 facilitate in holding the match results of the smaller TCAM devices until the match results associated with the largest TCAM is available at the outputs of the associated interface circuitry.

Figure 6:
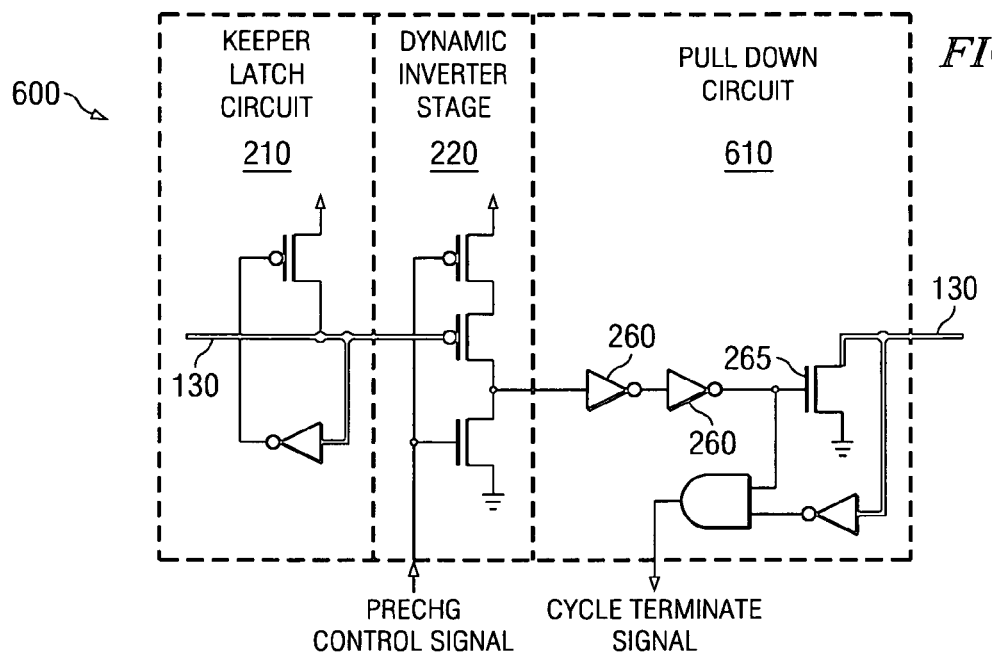
FIG. 6 is an example schematic diagram of an interface circuitry on a dummy match line of the hierarchical CAM system, such as those shown in FIG. 5.

Referring now to FIG. 6 there is illustrated an example schematic diagram of an interface circuitry 600 on a dummy match line 130 of the hierarchical CAM system architecture 500 (shown in FIG. 5). As shown in FIG. 6, the interface circuitry 600 includes the keeper latch circuit 210, the dynamic inverter stage 220, and a pull-down circuit 610.

Figure 7:
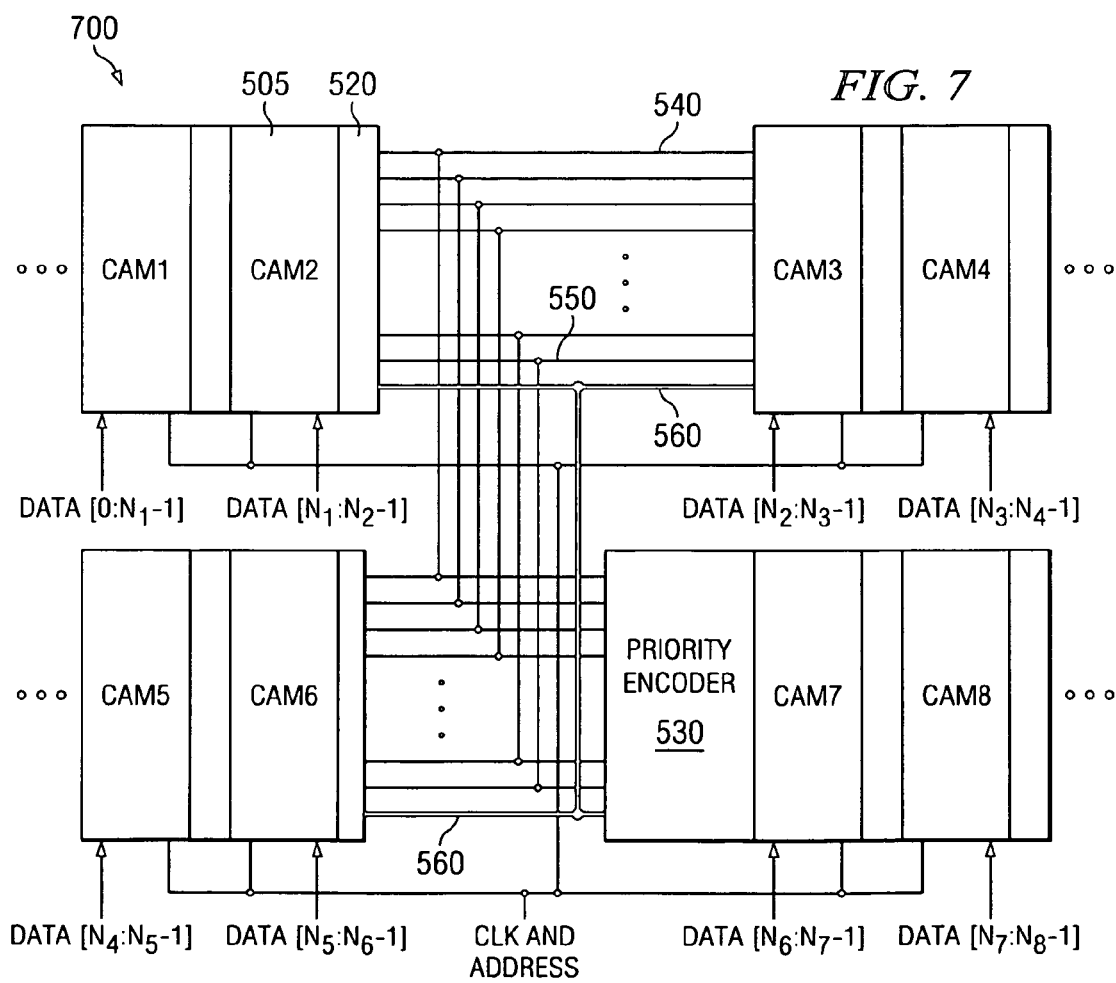
FIG. 7 is an example schematic diagram of a ripple-hierarchical CAM system such as those shown in FIGS. 1 and 5.

Referring now to FIG. 7 there is illustrated an example embodiment of another CAM system architecture that can be to obtain a wider CAM than what is possible with a single CAM. As shown in FIG. 7, the CAM system 700 connects multiple CAM devices 510 using the schemes described with reference to FIGS. 1 and 6. The CAM system architecture shown in FIG. 7 allows combining any number of CAMs to form a wider CAM than what is possible with the CAM systems shown in FIGS. 1 and 6. The operation of this CAM system 700 is described in more detail with reference to FIGS. 1-6.

The above-described architecture provides a combination of ripple cascade and hierarchical cascade schemes that can achieve cascading higher number of CAMs without compromising the performance. The above technique combines multiple CAMs to form a wider CAM.

The above-described technique provides various schemes to cascade a plurality of TCAMs. It is expected that the above-described methods and apparatus can also be implemented for binary CAMs (BCAMs), static CAMs, and/or dynamic CAMs.

While the present subject matter has been described with reference to static memory elements, it is anticipated that dynamic memory elements can also be used to store the data bits.

It is to be understood that the above description is intended to be illustrative, and not restrictive. Many other embodiments will be apparent to those of skill in the art upon reviewing the above description. The scope of the subject matter should, therefore, be determined with reference to the following claims, along with the full scope of equivalents to which such claims are entitled.

As shown herein, the present invention can be implemented in a number of different embodiments, including various methods, an apparatus, and a system. Other embodiments will be readily apparent to those of ordinary skill in the art. The elements, algorithms, and sequence of operations can all be varied to suit particular requirements.

FIGS. 1-7 are merely representational and are not drawn to scale. Certain proportions thereof may be exaggerated, while others may be minimized. FIGS. 1-7 illustrate various embodiments of the invention that can be understood and appropriately carried out by those of ordinary skill in the art.

It is emphasized that the Abstract is provided to comply with 37 C.F.R. § 1.72(b) requiring an Abstract that will allow the reader to quickly ascertain the nature and gist of the technical disclosure. It is submitted with the understanding that it will not be used to interpret or limit the scope or meaning of the claims.

In the foregoing detailed description of the embodiments of the invention, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the detailed description of the embodiments of the invention, with each claim standing on its own as a separate preferred embodiment.

The above description is intended to be illustrative, and not restrictive. Many other embodiments will be apparent to those skilled in the art. The scope of the invention should therefore be determined by the appended claims, along with the full scope of equivalents to which such claims are entitled.

The invention claimed is:

1. A system of content addressable memories (CAMs) for providing a search result in response to a received search word, comprising:
    a first content addressable memory (CAM) device;
    a plurality of global match (GMAT) lines and a dummy match line and their associated outputs of the first CAM device coupled to associated plurality of GMAT lines, dummy match lines, their associated outputs of a second through nth CAM device, respectively, wherein the plurality of GMAT lines of the first CAM device to couple to receive a portion of the search word, and wherein the dummy match line of the first CAM device to couple to receive a single mismatch signal which emulates a clock signal;
    a match latch circuit, wherein the match latch circuit has a plurality of latches, wherein the plurality of latches is coupled via the associated plurality of GMAT lines, the associated dummy match line used to clock match latches and the associated outputs to the nth CAM device that stores associated match signals received from the nth CAM device; and
    a priority encoder coupled to the match latch circuit that receives the match signals from the match latch circuit and outputs the search result upon receiving the clock signal via the dummy match line associated with each CAM, wherein the outputted search result is a combined search result obtained from outputted search results of each of the first through nth CAM device.

2. The system of claim 1, wherein each of the first CAM device through the nth CAM device comprises:
    a CAM and wherein the CAM has the plurality of GMAT lines and the dummy match line; and
    a plurality of associated GMAT interface circuitry, wherein each of the plurality of associated GMAT interface circuitry has a plurality of GMAT input terminals, a dummy match line input terminal, and associated outputs, wherein each GMAT line of the CAM is coupled to each of the associated plurality of GMAT line inputs, wherein the dummy match line of the CAM is coupled to the dummy match line input terminal, wherein the associated match outputs are coupled to the plurality of GMAT lines and the dummy match line of a substantially next CAM device.

3. The system of claim 2, wherein each CAM in the system is positioned in a formation to minimize physical distances between the first through nth CAM device, the match latch circuit, and the priority encoder.

4. A CAM system comprising:
    a plurality of CAM devices connected in a serial cascade arrangement, wherein each CAM device in the serial cascade arrangement connected to substantially adjacent CAM device by respective plurality of GMAT lines and a dummy match line, wherein each CAM device in the serial cascade arrangement to couple to receive a portion of a search word wherein a first CAM device generates a single mismatch signal and subsequent CAM devices propagate the single mismatch signal via associated dummy match line that is indicative of when match signals associated with the plurality of GMAT lines of each CAM device are available;
    a match latch circuit coupled to a last CAM device in the serial cascade arrangement via the respective plurality of GMAT lines and the dummy match line to receive match signals and the mismatch signal, respectively, from the last CAM device and to latch the received match signals upon receiving the mismatch signal via the dummy match line; and
    a priority encoder coupled to the match latch circuit to output combined search results upon receiving the mismatch signal via the dummy match line of the last CAM device.

5. The system of claim 4, wherein each CAM device comprises:
    a CAM, wherein the CAM includes the respective plurality of GMAT lines and the dummy match line;
    a plurality of associated GMAT interface circuitry including a plurality of input terminals and associated plurality of output terminals, wherein the input terminals are coupled to the plurality of GMAT lines, and wherein the plurality of output terminals is coupled to a plurality of GMAT lines and the dummy match line of a substantially adjacent CAM; and
    an associated clock interface circuitry including an input terminal and an output terminal, wherein the input terminal is coupled to the dummy match line, and wherein the output terminal is coupled to the dummy match line of the substantially adjacent CAM.

6. The system of claim 4, wherein the CAM includes memory type selected from the group consisting of ternary CAM (TCAM), binary CAM (BCAM), static CAM and dynamic CAM.

7. The system of claim 4, wherein the associated clock interface circuitry comprises:
 a keeper latch circuit coupled to the dummy match line of an associated CAM that receives the mismatch signal from the associated CAM via the dummy match line, wherein the keeper latch circuit supplies a leakage current to the dummy match line and maintains the mismatch signal in a logic high state;
 a dynamic inverter stage coupled to the keeper latch circuit that senses the logic high state on the dummy match line upon a precharge signal going to a logic low state; and
 a clock pull down circuit coupled to the dynamic inverter stage that outputs the mismatch signal to the dummy match line of the substantially adjacent CAM that is indicates completion of the search operation by maintaining a timing response similar to the plurality of GMAT lines.

8. The system of claim 4, wherein each associated GMAT interface circuitry comprises:
 a keeper latch circuit coupled to respective GMAT line that receives a match signal and maintains at a logic high state by receiving the leakage current via the respective GMAT line;
 a dynamic inverter stage coupled to the keeper latch circuit that senses the logic low state on the respective GMAT line upon the precharge signal going to a logic low state and generates a mismatch signal and
 a GMAT pull down circuit coupled to the dynamic inverter stage that outputs a match/mismatch signal to the respective GMAT line of the substantially adjacent CAM.

* * * * *